(12) United States Patent
Cheng et al.

(10) Patent No.: US 8,592,270 B2
(45) Date of Patent: Nov. 26, 2013

(54) NON-RELAXED EMBEDDED STRESSORS WITH SOLID SOURCE EXTENSION REGIONS IN CMOS DEVICES

(75) Inventors: Kangguo Cheng, Schenectady, NY (US); Bruce B. Doris, Brewster, NY (US); Ali Khakifirooz, Mountain View, CA (US); Pranita Kulkarni, Slingerlands, NY (US); Douglas C. La Tulipe, Jr., Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 13/115,314

(22) Filed: May 25, 2011

(65) Prior Publication Data

US 2012/0302019 A1 Nov. 29, 2012

(51) Int. Cl.
*H01L 21/336* (2006.01)
*H01L 21/8238* (2006.01)

(52) U.S. Cl.
USPC .... 438/217; 438/199; 438/558; 257/E21.633; 257/E21.409

(58) Field of Classification Search
USPC ............... 438/199, 229–233, 542, 546–549, 438/700–702, 442
See application file for complete search history.

(56) References Cited

U.S. PATENT DOCUMENTS

| | | | |
|---|---|---|---|
| 6,329,273 B1 | 12/2001 | Thurgate et al. | |
| 6,489,207 B2 | 12/2002 | Furukawa et al. | |
| 6,620,668 B2 | 9/2003 | Lee et al. | |
| 6,849,528 B2 | 2/2005 | Chakravarthi et al. | |
| 7,009,258 B2 | 3/2006 | Park et al. | |
| 7,316,960 B2 | 1/2008 | Ting | |
| 7,531,435 B2* | 5/2009 | Momiyama | 438/514 |
| 7,723,174 B2* | 5/2010 | Waite et al. | 438/216 |
| 7,875,521 B2* | 1/2011 | Shimamune et al. | 438/300 |
| 2005/0233558 A1* | 10/2005 | Yamamoto et al. | 438/542 |
| 2006/0008964 A1* | 1/2006 | Mineji | 438/199 |
| 2009/0267149 A1* | 10/2009 | Hua et al. | 257/347 |
| 2010/0047985 A1* | 2/2010 | Dakshina Murthy et al. | 438/303 |
| 2010/0065924 A1 | 3/2010 | Lin et al. | |
| 2010/0164020 A1* | 7/2010 | Kronholz et al. | 257/408 |
| 2010/0219475 A1* | 9/2010 | Kronholz et al. | 257/351 |
| 2011/0284962 A1* | 11/2011 | Chang et al. | 257/351 |
| 2012/0149159 A1* | 6/2012 | Liu et al. | 438/233 |

OTHER PUBLICATIONS

J. Bennett et al., "Formation of p+ Shallow Junctions Using SiGe Barriers," J. Vac. Sci. Technol. B, vol. 22, No. 5, Sep./Oct. 2004, pp. 2333-2336.

(Continued)

*Primary Examiner* — Savitr Mulpuri
(74) *Attorney, Agent, or Firm* — Cantor Colburn LLP; Vazken Alexanian

(57) ABSTRACT

A method of forming a field effect transistor (FET) device includes forming a patterned gate structure over a substrate; forming a solid source dopant material on the substrate, adjacent sidewall spacers of the gate structure; performing an anneal process at a temperature sufficient to cause dopants from the solid source dopant material to diffuse within the substrate beneath the gate structure and form source/drain extension regions; following formation of the source/drain extension regions, forming trenches in the substrate adjacent the sidewall spacers, corresponding to source/drain regions; and forming an embedded semiconductor material in the trenches so as to provide a stress on a channel region of the substrate defined beneath the gate structure.

9 Claims, 20 Drawing Sheets

(56) References Cited

OTHER PUBLICATIONS

Y. S. Kim et al., "A Highly Robust SiGe Source Drain Technology Realized by Disposable Sidewall Spacer (DSW) for 65nm Node and Beyond," Proceedings of ESSDERC, Grenoble, France, 2005, pp. 305-308.

T. Noda et al., "Modeling and Experiments of Dopant Diffusion and Defects for Laser Annealed Junctions and Advanced USJ," Mater. Res. Soc. Symp. Proc., vol. 1070, 2008, 1070-E01-03.

C. H. Tsai et al., "Unique Ultra Shallow Junction Scheme with Conventional Activation Process," 2006 Symposium on VLSI Technology, 2006, pp. 188-189.

* cited by examiner

NON-RELAXED EMBEDDED STRESSORS WITH SOLID SOURCE EXTENSION REGIONS IN CMOS DEVICES

BACKGROUND

The present invention relates generally to semiconductor device manufacturing and, more particularly, to a transistor device having non-relaxed, embedded stressors with solid source outdiffused extension regions.

The gain of a metal oxide semiconductor (MOS) transistor, usually defined by the transconductance ($g_m$), is proportional to the mobility ($\mu$) of the majority carrier in the transistor channel. The current carrying capability, and hence the performance of an MOS transistor, is proportional to the mobility of the majority carrier in the channel. The mobility of holes, which are the majority carriers in a P-channel field effect (PFET) transistor, and the mobility of electrons, which are the majority carriers in an N-channel field effect (NFET) transistor, may be enhanced by applying an appropriate stress to the channel. Existing stress engineering methods greatly enhance circuit performance by increasing device drive current without increasing device size and device capacitance. For example, a tensile stress liner layer formed over an NFET transistor induces a longitudinal stress in the channel and enhances the electron mobility. Conversely, a compressive stress liner formed over a PFET transistor induces a compressive stress in the channel and enhances the hole mobility.

In lieu of (or in addition to) stress liner layers, embedded source and drain regions may be epitaxially grown adjacent an FET channel, such as by removing portions of a semiconductor substrate material (e.g., silicon) and then regrowing a different semiconductor material in the recesses adjacent the channel. In the case of an NFET device, such an embedded stressor material may be silicon carbon (Si:C) for example, while in the case of a PFET device, such an embedded stressor material may be silicon germanium (SiGe) for example. With either approach (liner layer or embedded stressors), the resulting enhanced carrier mobility, in turn, leads to higher drive currents and therefore higher circuit level performance.

The continuous scaling of transistor devices has produced a series of difficult challenges to the processes used to form the active layers in deep sub-micron transistors. Two major requirements in the downsizing of MOSFETs are the suppression of "off" state leakage currents, and low resistance for a high current drive in the "on" state. In small gate lengths even when the device is in the "off" state, a leakage current from the drain to the source is observed due to the lowering of the threshold voltage ($V_T$) as gate length is decreased. The space charge region near the drain may also touch the source somewhere deeper in the substrate where the gate bias cannot control the potential and punch through occurs at smaller drain biases. The off current is a key design parameter and can be minimized by keeping the junctions shallow.

However, ion implantation to form ultra-shallow junctions (e.g., less than about 300 Angstroms) is increasingly difficult to control. For example, higher dopant implant concentrations are required to avoid an increase in parasitic resistances at shallower junction depths. While reducing the ion implant energy may result in shallower junctions, the higher required dopant concentration required contributes to significant semiconductor substrate damage including forming amorphous or disordered lattice regions. Consequently, solid source diffusion is an alternative approach to forming source/drain junction regions. Here, a solid phase diffusion source layer is formed on a substrate, followed by an annealing step (e.g., rapid thermal anneal, laser anneal, spike anneal) to diffuse the dopant impurities within the diffusion source layer.

Accordingly, the semiconductor industry continually faces challenges with regard to maintaining good carrier mobility, as well as forming shallow junctions as the devices continue to scale.

SUMMARY

In an exemplary embodiment, a method of forming a field effect transistor (FET) device includes forming a patterned gate structure over a substrate; forming a solid source dopant material on the substrate, adjacent sidewall spacers of the gate structure; performing an anneal process at a temperature sufficient to cause dopants from the solid source dopant material to diffuse within the substrate beneath the gate structure and form source/drain extension regions; following formation of the source/drain extension regions, forming trenches in the substrate adjacent the sidewall spacers, corresponding to source/drain regions; and forming an embedded semiconductor material in the trenches so as to provide a stress on a channel region of the substrate defined beneath the gate structure.

In another embodiment, a method of forming complementary metal oxide semiconductor (CMOS) devices includes forming a patterned p-type field effect transistor (PFET) gate structure and a patterned n-type field effect transistor (NFET) gate structure over a substrate; forming a first solid source dopant material on the substrate, adjacent sidewall spacers of the PFET gate structure, and a second solid source dopant material on the substrate, adjacent sidewall spacers of the NFET gate structure; performing an anneal process at a temperature sufficient to cause dopants from the first and second solid source dopant materials to diffuse within the substrate beneath the PFET gate structure and NFET gate structure, respectively, so as to form source/drain extension regions; following formation of the source/drain extension regions, forming trenches in the substrate adjacent the sidewall spacers of the PFET and NFET gate structures, corresponding to source/drain regions; forming a first embedded semiconductor material in the trenches adjacent the sidewall spacers of the PFET gate structure so as to provide a compressive stress on a channel region of the substrate defined beneath the PFET gate structure; and forming a second embedded semiconductor material in the trenches adjacent the sidewall spacers of the NFET gate structure so as to provide a tensile stress on a channel region of the substrate defined beneath the NFET gate structure.

In another embodiment, a method of forming complementary metal oxide semiconductor (CMOS) devices includes forming a patterned field effect transistor FET gate structure of a first polarity type and a patterned FET gate structure of a second polarity type over a substrate; selectively forming trenches in the substrate adjacent the sidewall spacers of the FET gate structure of the first polarity type; forming a solid source dopant material on the substrate, in the trenches adjacent the sidewall spacers of the FET gate structure of the first polarity type, and adjacent sidewall spacers of the FET gate structure of the second polarity type; performing an anneal process at a temperature sufficient to cause dopants from the solid source dopant material to diffuse within the substrate beneath the FET gate structure of the second polarity type and FET gate structure of the first polarity type, respectively, so as to form source/drain extension regions beneath the FET gate structure of the second polarity type and halo regions beneath the FET gate structure of the first polarity type; removing remaining portions of the solid source dopant material not diffused beneath the FET gate structure of the second polarity type and FET gate structure of the first polarity type; forming additional trenches in the substrate adjacent the sidewall spacers of the FET gate structures, corresponding to source/drain regions; forming a first embedded semiconductor material in the additional trenches adjacent the sidewall spacers of the FET gate structure of the first polarity type so as to provide a first type of stress on a channel region of the substrate defined beneath the FET gate structure of the first polarity type; and forming a second embedded semiconductor material in the additional trenches adjacent the sidewall spacers of the FET gate structure of the second polarity type so as to provide a second type of stress on a channel region of the substrate defined beneath the FET gate structure of the second polarity type.

BRIEF DESCRIPTION OF THE SEVERAL VIEWS OF THE DRAWINGS

Referring to the exemplary drawings wherein like elements are numbered alike in the several Figures:

FIGS. 1 through 8 are a series of cross sectional views illustrating a method of forming a transistor device having non-relaxed, embedded stressors with solid source outdiffused extension regions, in accordance with an exemplary embodiment, in which:

FIG. 1 illustrates the formation of an NFET and a PFET gate structure on a semiconductor substrate, separated by a shallow trench isolation region;

FIG. 2 illustrates the formation of a solid source dopant material on the structure of FIG. 1, selective to the PFET device;

FIG. 3 illustrates the formation of another solid source dopant material on the structure of FIG. 2, selective to the NFET device;

FIG. 4 illustrates the formation of extension regions in both the PFET device and NFET device of FIG. 3, through an annealing process to out diffuse the dopant materials;

FIG. 5 illustrates the formation of halo regions in both the PFET device and NFET device of FIG. 4, through a halo implant process and subsequent anneal;

FIG. 6 illustrates a recess of the semiconductor substrate material in the source/drain regions of the PFET and NFET device of FIG. 5;

FIG. 7 illustrates the selective formation of an embedded, in situ doped semiconductor material in the recessed regions of the PFET device of FIG. 6;

FIG. 8 illustrates the selective formation of an embedded, in situ doped semiconductor material in the recessed regions of the NFET device of FIG. 7;

FIGS. 9 through 14 are a series of cross sectional views illustrating a method of forming a transistor device having non-relaxed, embedded stressors with solid source outdiffused halo and extension regions, in accordance with another exemplary embodiment, in which:

FIG. 9 illustrates a recess of the semiconductor substrate material in the source/drain regions of the NFET device of FIG. 1;

FIG. 10 illustrates the formation of a solid source dopant material on the structure of FIG. 7, including both the NFET device and the PFET device;

FIG. 11 illustrates the formation of extension regions in the PFET device and halo regions of the NFET device of FIG. 10, through an annealing process to out diffuse the dopant material;

FIG. 12 illustrates a recess of the unmasked solid source dopant material over the source/drain regions of the PFET and NFET device of FIG. 13;

FIG. 13 illustrates a recess of the semiconductor substrate material in the source/drain regions of the PFET and NFET device of FIG. 12;

FIG. 14 illustrates the formation of embedded, in situ doped semiconductor materials in the recessed regions of the PFET and NFET device of FIG. 13;

FIGS. 15 through 20 are a series of cross sectional views illustrating a method of forming a transistor device having non-relaxed, embedded stressors with solid source outdiffused halo and extension regions, in accordance with another exemplary embodiment, in which:

FIG. 15 illustrates a recess of the semiconductor substrate material in the source/drain regions of the PFET device of FIG. 1;

FIG. 16 illustrates the formation of a solid source dopant material on the structure of FIG. 15, including both the NFET device and the PFET device;

FIG. 17 illustrates the formation of extension regions in the NFET device and halo regions of the PFET device of FIG. 16, through an annealing process to out diffuse the dopant material;

FIG. 18 illustrates a recess of the unmasked solid source dopant material over the source/drain regions of the PFET and NFET device of FIG. 17;

FIG. 19 illustrates a recess of the semiconductor substrate material in the source/drain regions of the PFET and NFET device of FIG. 18; and FIG. 20 illustrates the formation of embedded, in situ doped semiconductor materials in the recessed regions of the PFET and NFET device of FIG. 19.

DETAILED DESCRIPTION

As indicated above, both carrier mobility and ultra-shallow junction formation of semiconductor transistor devices are of continued importance in the industry. With respect to solid source diffusion, the high temperature processes are used to activate the dopant materials. However, this diffusion anneal is a high thermal budget process which causes stress relaxation in stress films. As a result, conventional solid source diffusion combined with conventionally formed embedded stressors may result in relaxed or weakened stressors. Accordingly, the embodiments disclosed herein overcome such issues by forming complementary metal oxide semiconductor (CMOS) devices with solid source, out diffused junctions with embedded stressors that are not relaxed as a result of high temperature thermal processing.

Figure 1:
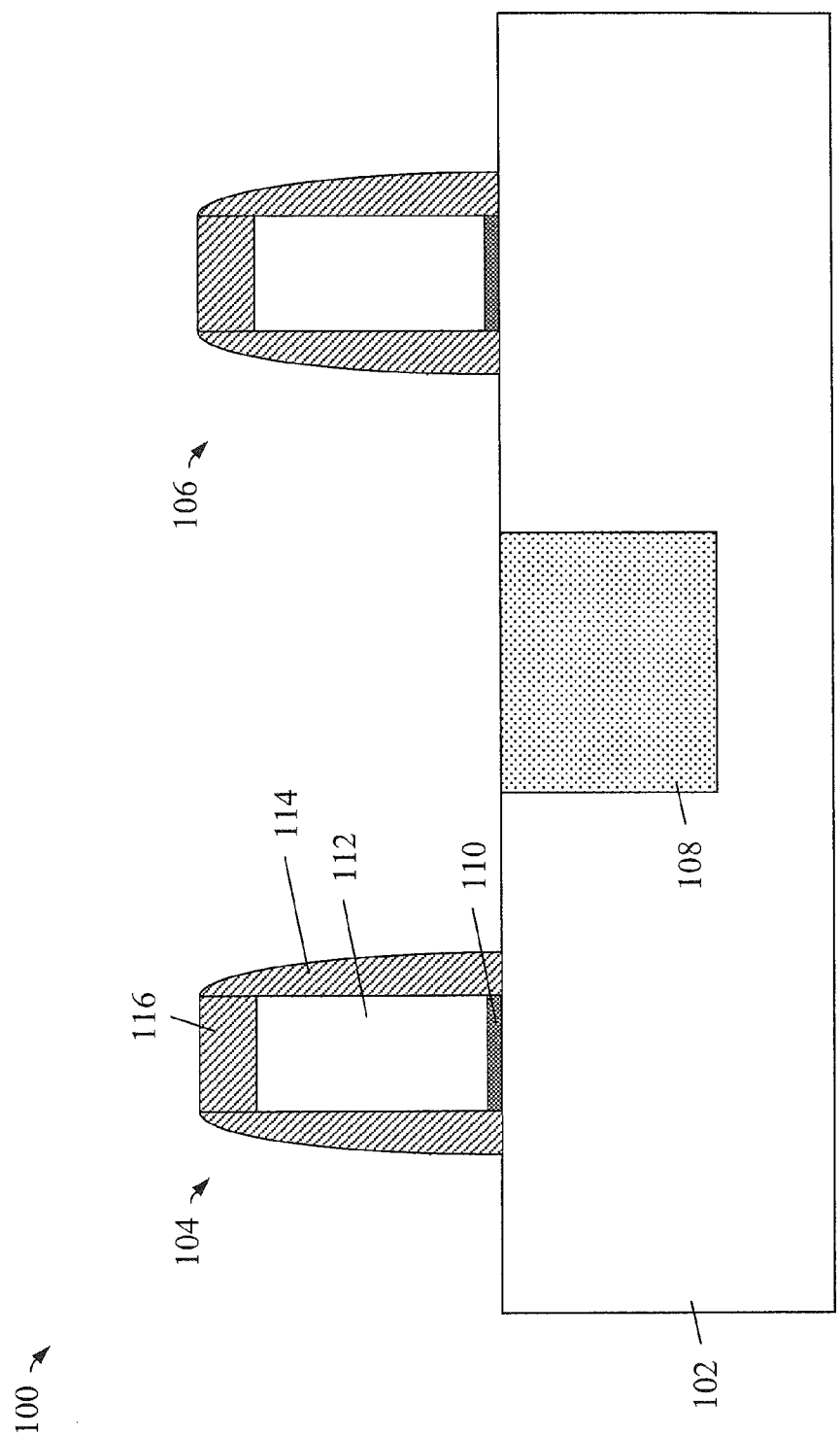

Referring initially to FIGS. 1 through 8, there is shown a series of cross sectional views illustrating a method of forming a transistor device 100 having non-relaxed, embedded stressors with solid source outdiffused extension regions, in accordance with an exemplary embodiment. As shown in FIG. 1, the device 100 includes a starting substrate 102 which may be a bulk wafer, such as silicon, for example. The substrate 102 may also be a semiconductor-on-insulator, or a more specifically a silicon-on-insulator (SOI) substrate as known in the art. As further shown in FIG. 1, a gate structure for an NFET device 104 and a gate structure for a PFET device are formed on the substrate 102, and electrically isolated from one another by a shallow trench isolation region 108, such as an oxide for example.

The gate structures for the NFET device 104 and the PFET device 106 are formed from the same or substantially similar materials, and thus only one of which are described in further detail. A gate dielectric layer 110, such as an oxide, nitride, oxynitride, or a high-k material is formed on the substrate 102, with a gate electrode layer 112 or layers formed over the gate dielectric layer 110. The gate electrode layer 112 (or layers) may include materials such as polysilicon and/or metal materials, fore example. Moreover, the gate structures may be formed in accordance with a gate first or a gate last process flow. In addition, the gate structures also include sidewall spacers 114 (e.g., a nitride material), as well as a protective hardmask 116 formed atop the gate electrode 112. The hardmask 116 may also be a nitride material, for example.

Figure 2:
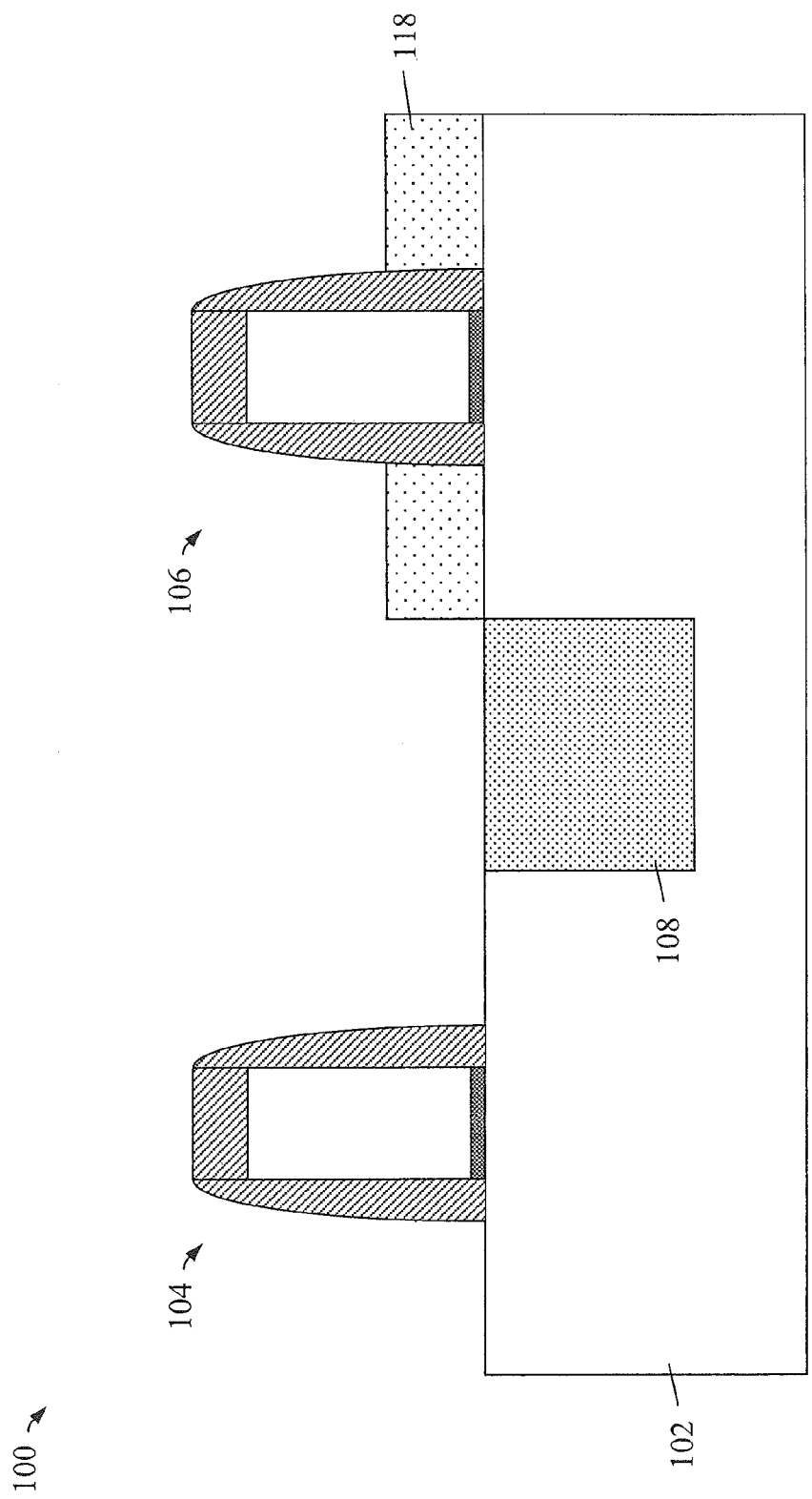

As then shown in FIG. 2, a first solid source dopant material 118 on the structure of FIG. 1, selective to the PFET device 106. More specifically, a semiconductor material such as silicon or silicon germanium, for example, having a p-type dopant (e.g., boron) is epitaxially grown on the substrate 102 adjacent the sidewalls of the PFET device 106. Selectivity to the PFET device 106 may be achieved, for example, by growing the first solid source dopant material 118 over all of the exposed surfaces of the semiconductor substrate 102 (i.e., growing the material on both NFET and PFET regions), followed by hardmask and/or resist patterning and removal of the first solid source dopant material 118 from the NFET regions. Alternatively, a patterned masking material may be first formed over the NFET regions such that the first solid source dopant material 118 is only selectively grown on the PFET regions.

Figure 3:
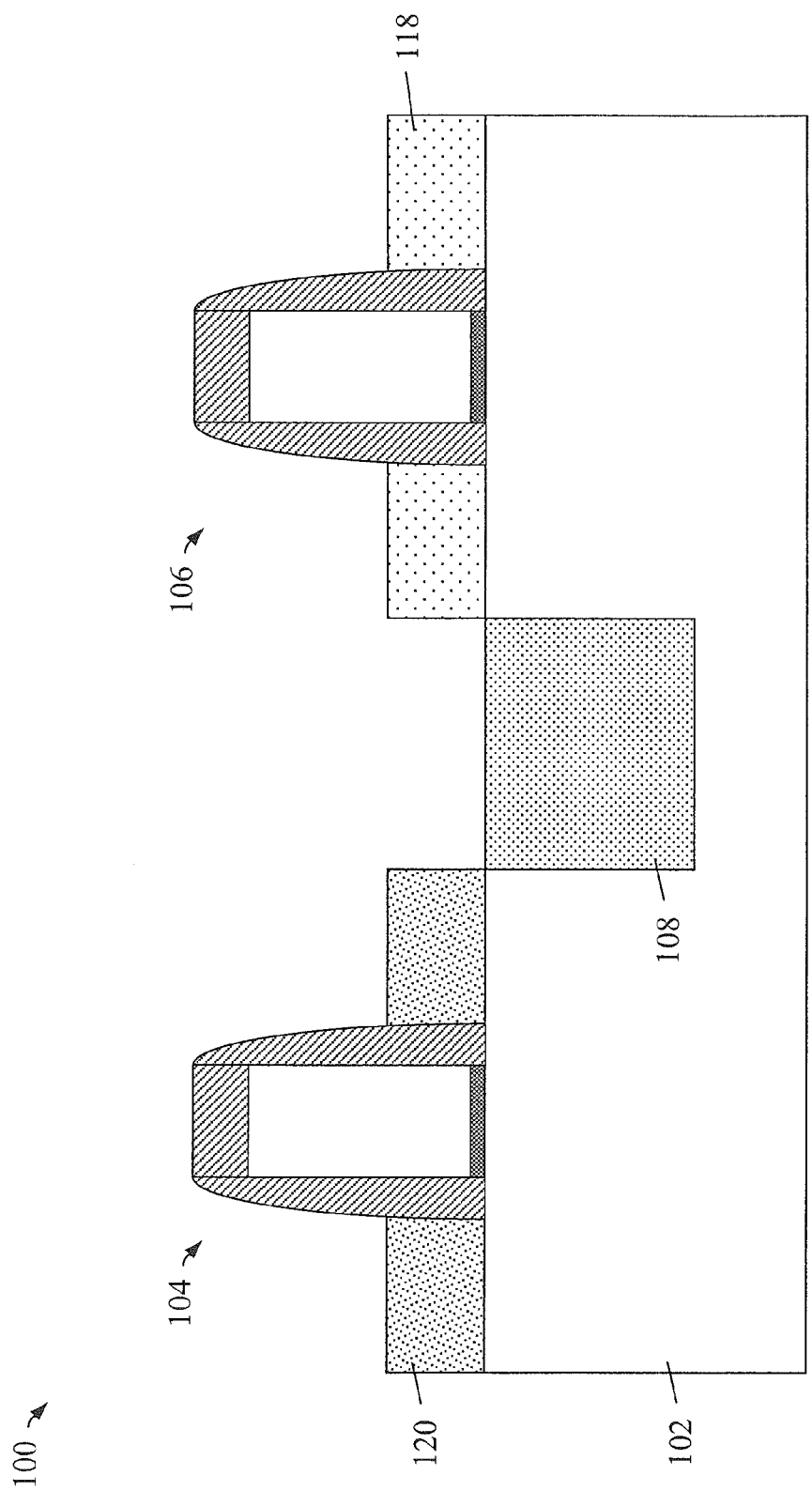

Then, as shown in FIG. 3, a second solid source dopant material 120 is selectively epitaxially grown on the substrate 102 adjacent the sidewalls of the NFET device 104. More specifically, a semiconductor material such as silicon or silicon carbon, for example, having an n-type dopant (e.g., phosphorous) is epitaxially grown on the substrate 102 adjacent the sidewalls of the NFET device 104. Selectivity to the NFET device 104 may be achieved, for example, by growing the second solid source dopant material 120 over all of the exposed surfaces of the semiconductor substrate 102 and first solid source dopant material 118 (i.e., growing the material on both NFET and PFET regions), followed by hardmask and/or resist patterning and removal of the second solid source dopant material 120 from the PFET regions. Alternatively, a patterned masking material may be first formed over the PFET regions such that the second solid source dopant material 120 is only selectively grown on the NFET regions.

Figure 4:
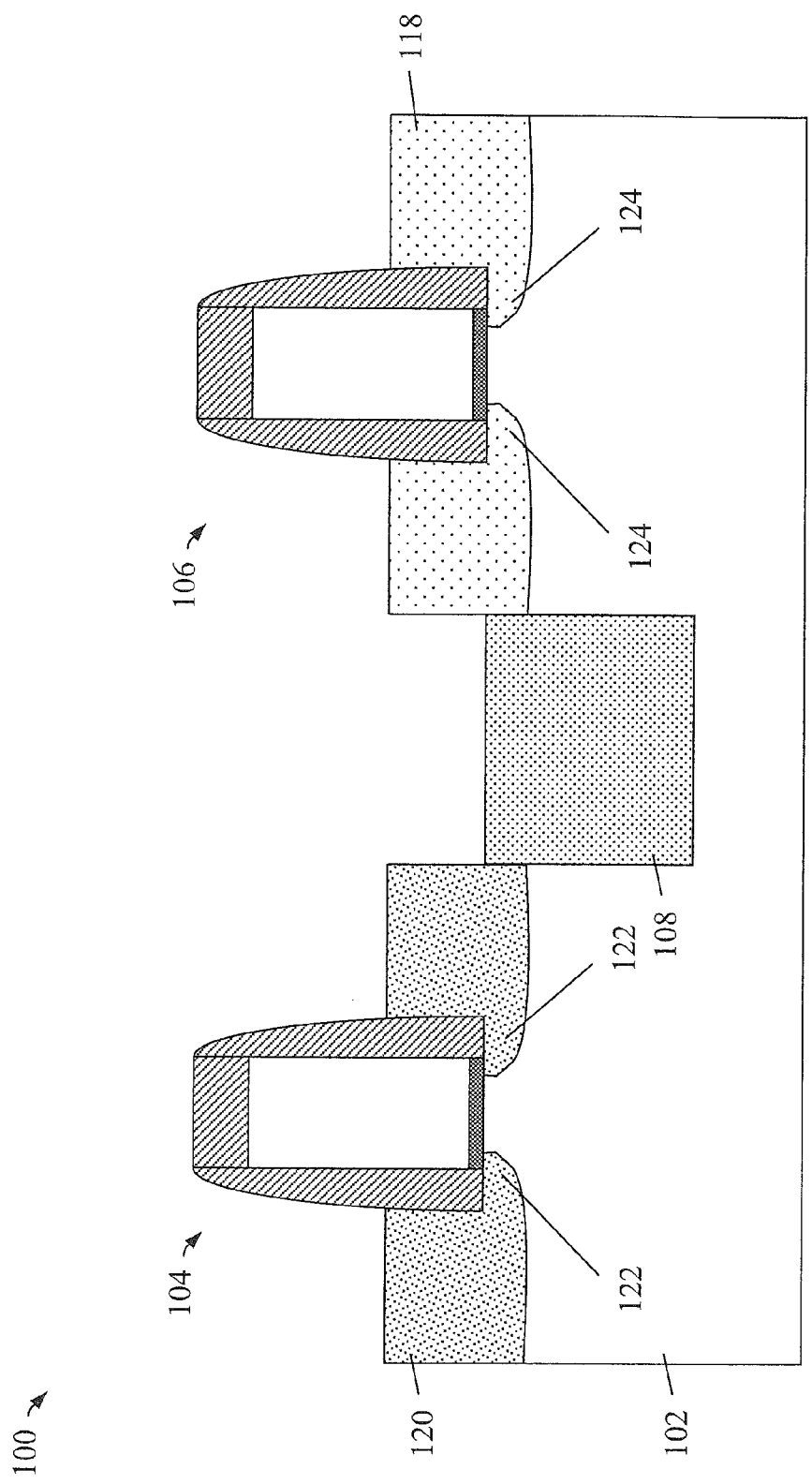
Figure 5:
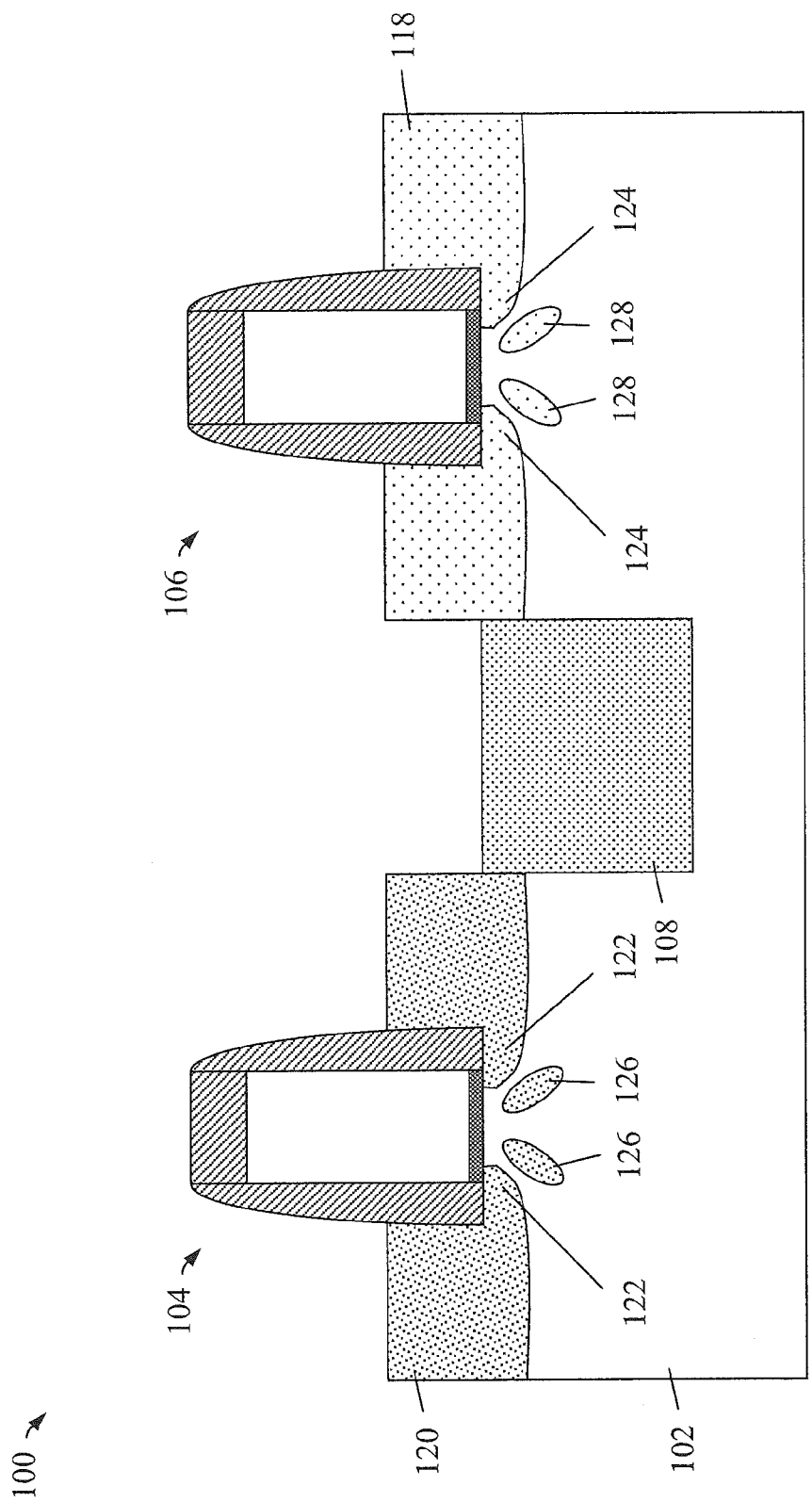

Once both the first solid source dopant material 118 and the second solid source dopant material 120 are in place, the device 100 is subject to a relatively high temperature annealing process so as to out diffuse the p-type and n-type dopant materials, thereby forming NFET extension regions 122 and PFET extension regions 124 as shown in FIG. 4. This high temperature process may be, for example, a rapid thermal anneal (RTA) such as a spike anneal at a temperature of about 1080° C. Notably, this high temperature out diffusion process is performed prior to embedded stress layer formation for the transistor devices. Following the high temperature anneal, selective angled implantation processes are performed as known in the art so as to form PFET halo implants 126 and NFET halo implants 128, in no particular order, as shown in FIG. 5. The PFET halo implants 126 and NFET halo implants 128 may then be activated by annealing.

Figure 6:
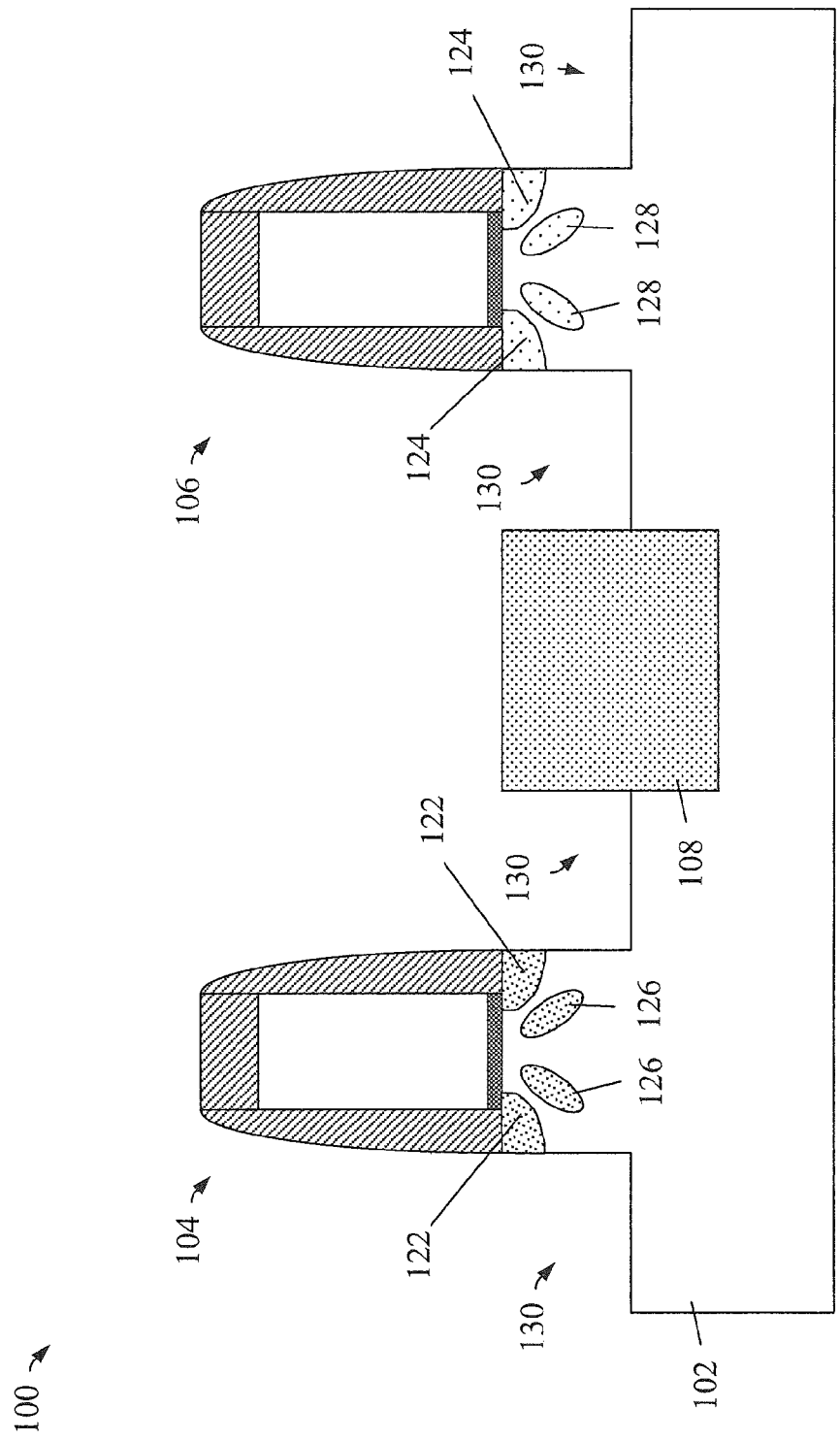

Referring now to FIG. 6, an etching process is used to remove the NFET and PFET solid source dopant materials, as well as portions of the substrate, thereby defining trenches 130 in the substrate 102, adjacent the NFET and PFET gate structures and corresponding to source and drain regions of the transistors. The etching process may be, for example, a dry etch process or a wet etch process that is selective to the dielectric material used to form the sidewall spacers and gate protective hardmask. The etching process is also selective to the dielectric material used to form the shallow trench isolation 108.

Figure 7:
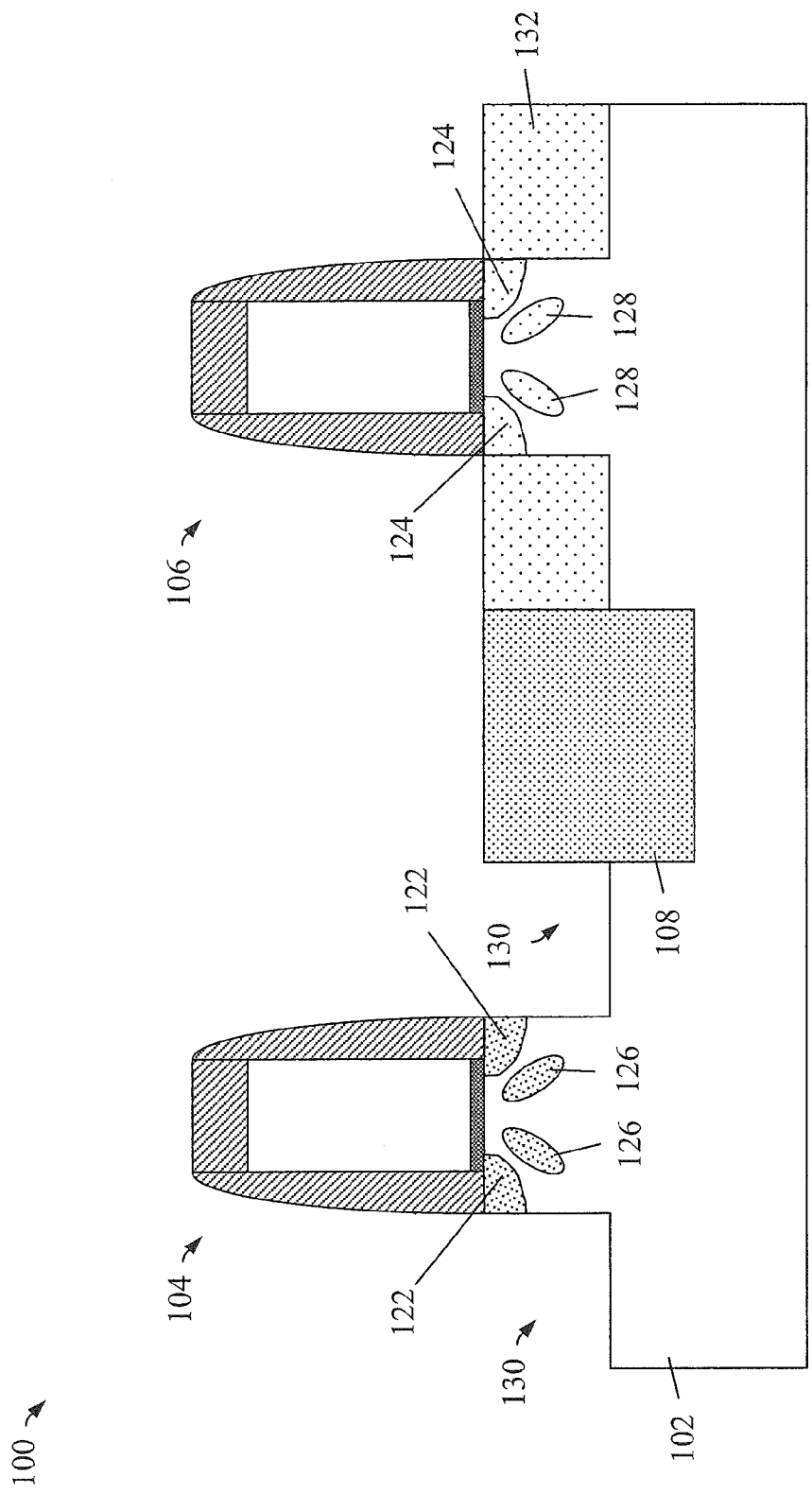

As shown in FIG. 7, p-type embedded stress layers 132 are selectively grown in the trenches 130 of the PFET device 106. In an exemplary embodiment, the stress layers 132 are formed by epitaxially growing a semiconductor material that provides a compressive stress on the channel region below the gate structure of the PFET device 106. More specifically, stress layers 132 include an in situ, boron doped silicon germanium material epitaxially grown on the substrate 102 adjacent the sidewalls of the PFET device 106. As was the case for the solid source material, selectivity to the PFET device 106 may be achieved, for example, by growing the silicon germanium stress layers 132 over all of the exposed surfaces of the semiconductor substrate 102 (i.e., growing the material on both NFET and PFET regions), followed by hardmask and/or resist patterning and removal of the stress layers 132 from the NFET regions. Alternatively, a patterned masking material may be first formed over the NFET regions such that the p-type embedded stress layers 132 are only selectively grown on the PFET regions.

Figure 8:
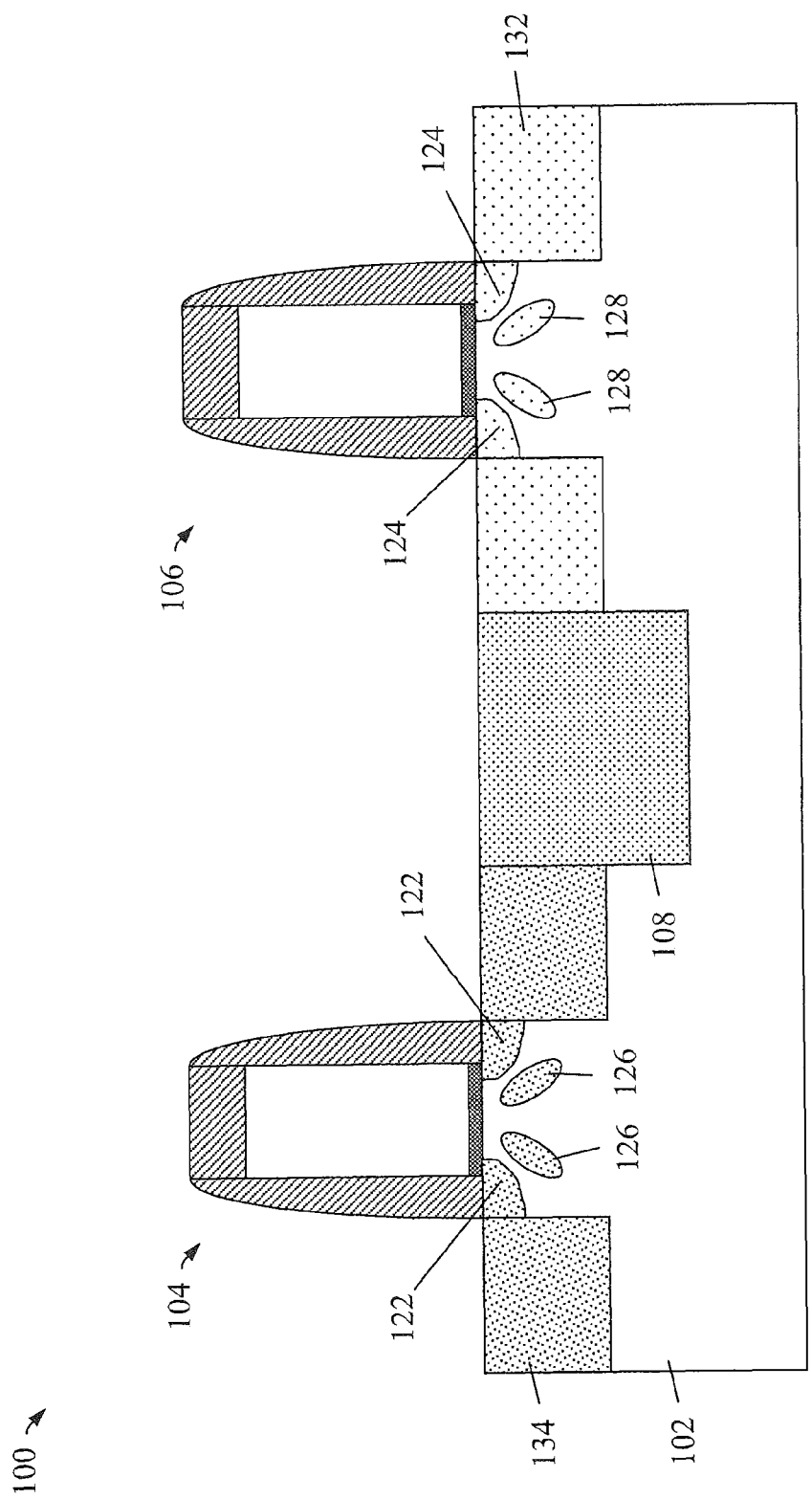

In a similar manner, n-type embedded stress layers 134 are selectively grown in the trenches 130 of the NFET device 104 as shown in FIG. 8. In an exemplary embodiment, the stress layers 134 are formed by epitaxially growing a semiconductor material that provides a tensile stress on the channel region below the gate structure of the NFET device 104. More specifically, stress layers 134 include an in situ, phosphorous doped silicon carbon material epitaxially grown on the substrate 102 adjacent the sidewalls of the NFET device 104. Selectivity to the NFET device 104 may be achieved by growing the silicon carbon stress layers 134 over all of the exposed semiconductor surfaces of the device, followed by hardmask and/or resist patterning and removal of the stress layers 134 from the PFET regions. Alternatively, a patterned masking material may be first formed over the PFET regions such that the n-type embedded stress layers 134 are only selectively grown on the NFET regions. The dopants of both the compressive embedded stress layers 132 and the tensile embedded stress layers 134 may be activated using a laser or other millisecond scale anneal that does not cause relation of the stress layers 132, 134. Alternatively, the source and drain regions are not annealed; since the dopants are grown into lattice sites, they are already active. From there, conventional CMOS processing as known in the art may continue. It will be appreciated that by performing the high temperature, solid source annealing to form the extension regions prior to embedded source/drain formation, the embedded stressors are not relaxed as a result of any subsequent high temperature thermal processing.

In addition to using solid source dopant material for extension region formation prior to embedded stress region formation, a solid source dopant material may also be used for halo region formation in one or more transistor devices. For example, FIGS. 9 through 14 are a series of cross sectional views illustrating a method of forming a transistor device having non-relaxed, embedded stressors with solid source outdiffused halo and extension regions, in accordance with another exemplary embodiment.

Figure 9:
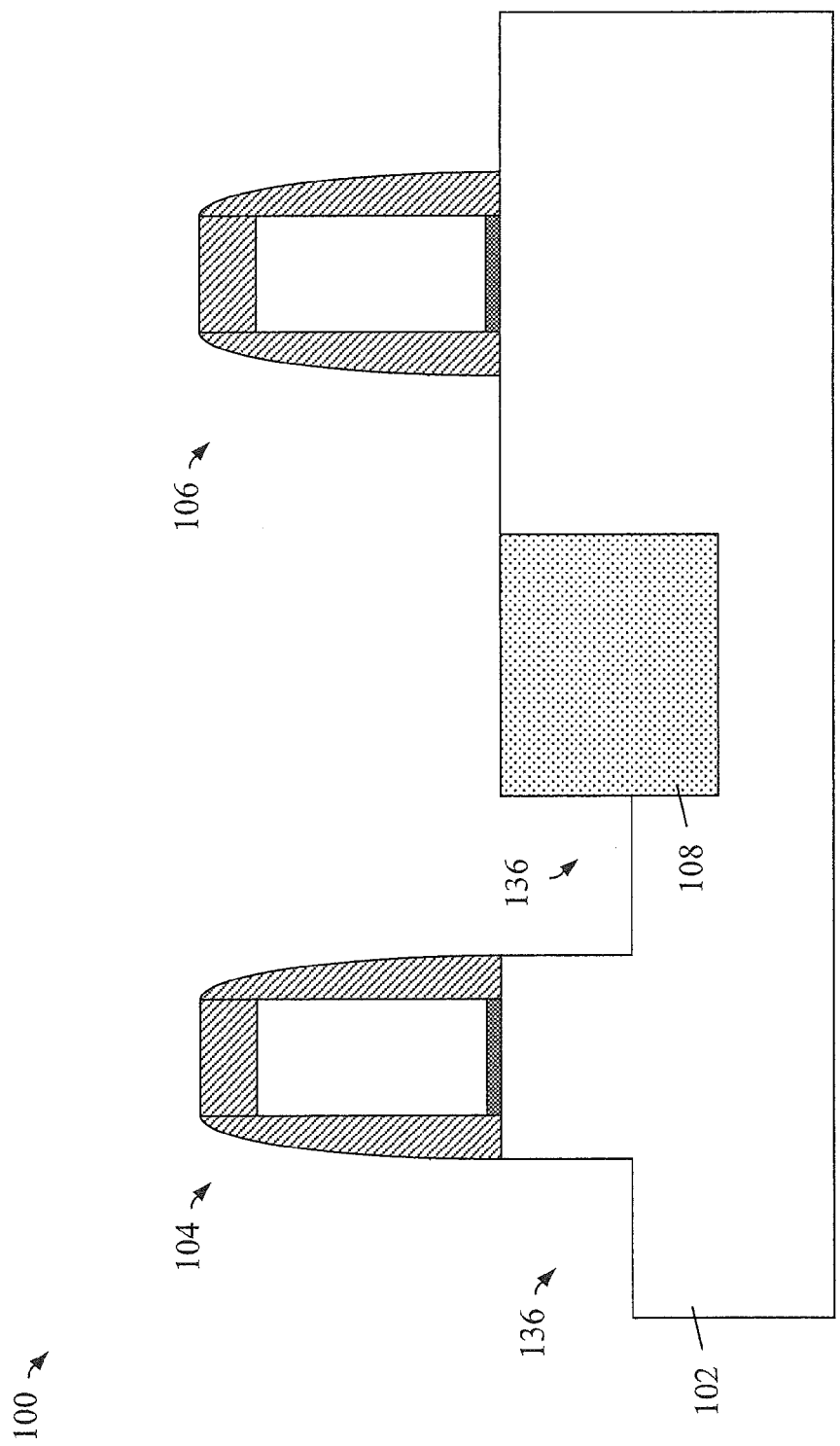

After initial formation of an NFET device 104 and a PFET device 106 on a substrate 102 (such as in FIG. 1), FIG. 9 illustrates selective etching of trenches 136 in the substrate 102, adjacent the NFET gate structure corresponding to source and drain regions of the NFET device 104. The etching process may be, for example, a dry etch process or a wet etch process that is selective to the dielectric material used to form the sidewall spacers and gate protective hardmask. The etching process is also selective to the dielectric material used to form the shallow trench isolation 108. During this selective etching process, the PFET device 106 may be protected using, for example a patterned resist material or a patterned hardmask layer (not shown).

Figure 10:
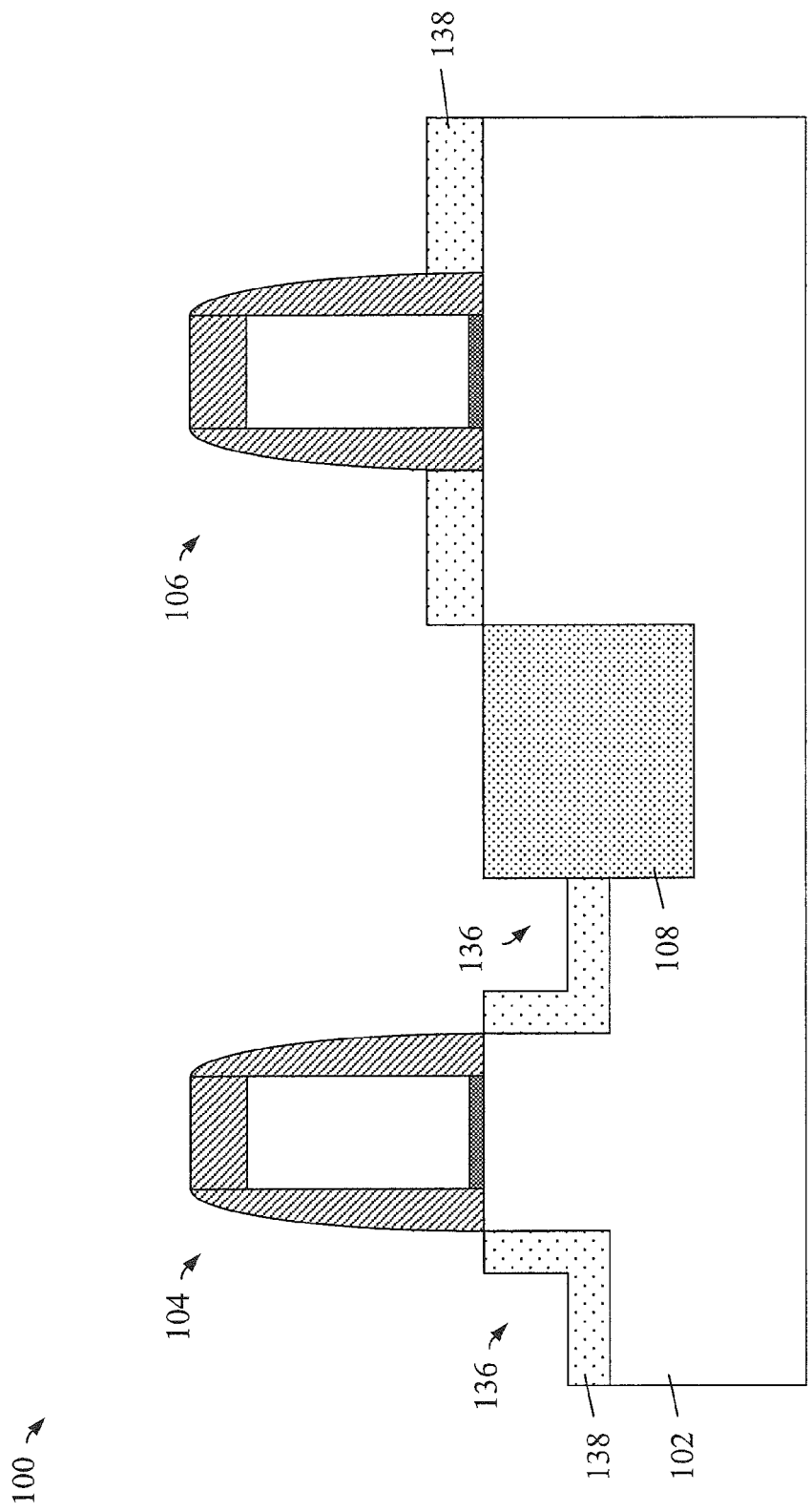
Figure 11:
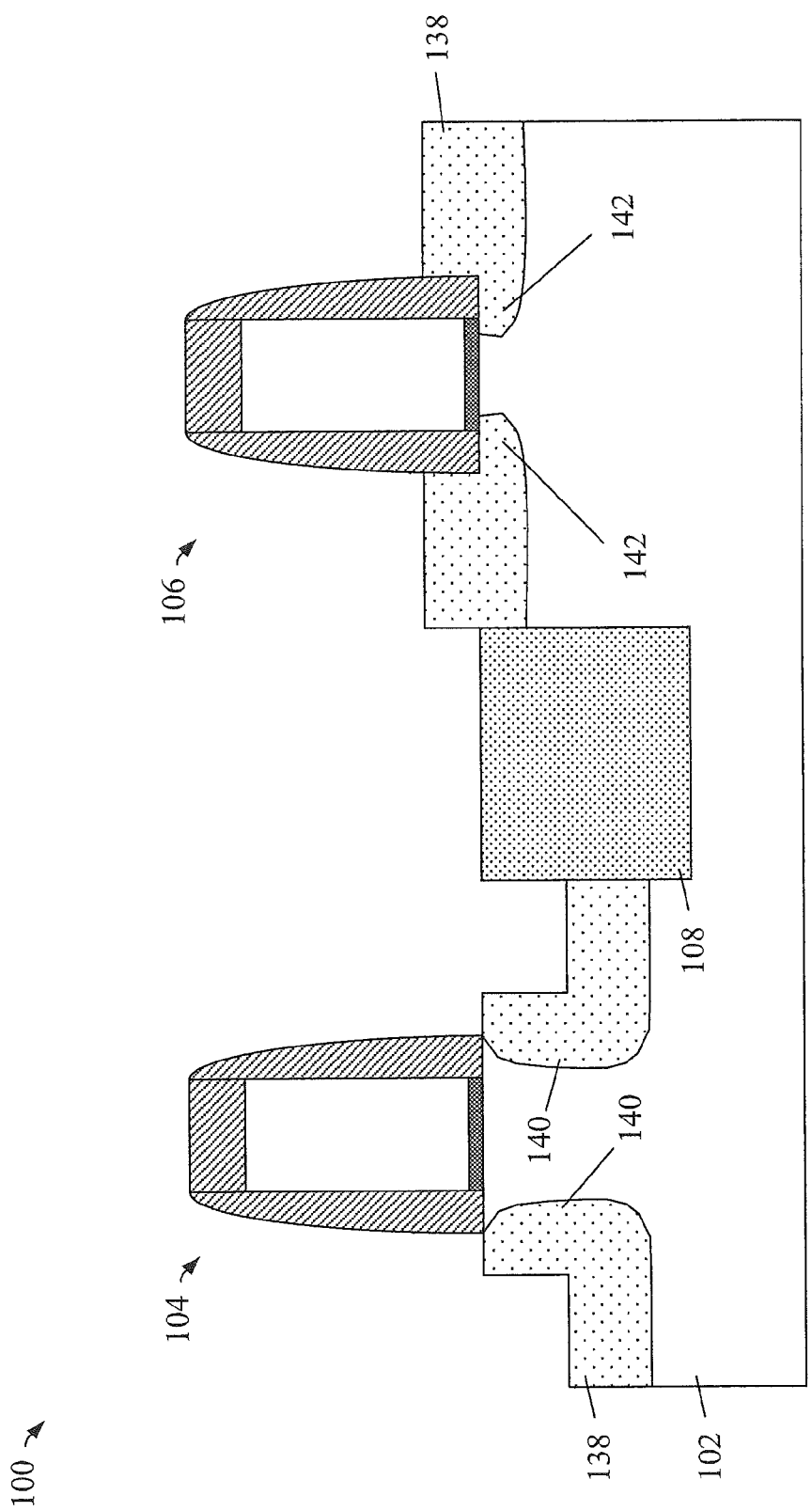

Then, as shown in FIG. 10, an in situ, boron doped silicon germanium material 138 is epitaxially grown on the substrate 102. In the case of the PFET device 106, the doped SiGe material 138 is formed adjacent the gate sidewall spacers, and in the case of the NFET device 104, the doped SiGe material 138 is formed along bottom and sidewall surfaces of the trenches 136 in the substrate 102. Once the boron doped silicon germanium material 138 is in place, the device 100 is subject to a relatively high temperature annealing process so as to out diffuse the boron dopant materials, thereby forming both NFET halo regions 140 and PFET extension regions 142 as shown in FIG. 11. This high temperature process may be, for example, a rapid thermal anneal (RTA) such as a spike anneal at a temperature of about 1080° C. Again, this high temperature out diffusion process is performed prior to embedded stress layer formation for the transistor devices. Optionally, the substrate beneath the NFET device 104 may be laterally etched for optimal halo region location.

Figure 12:
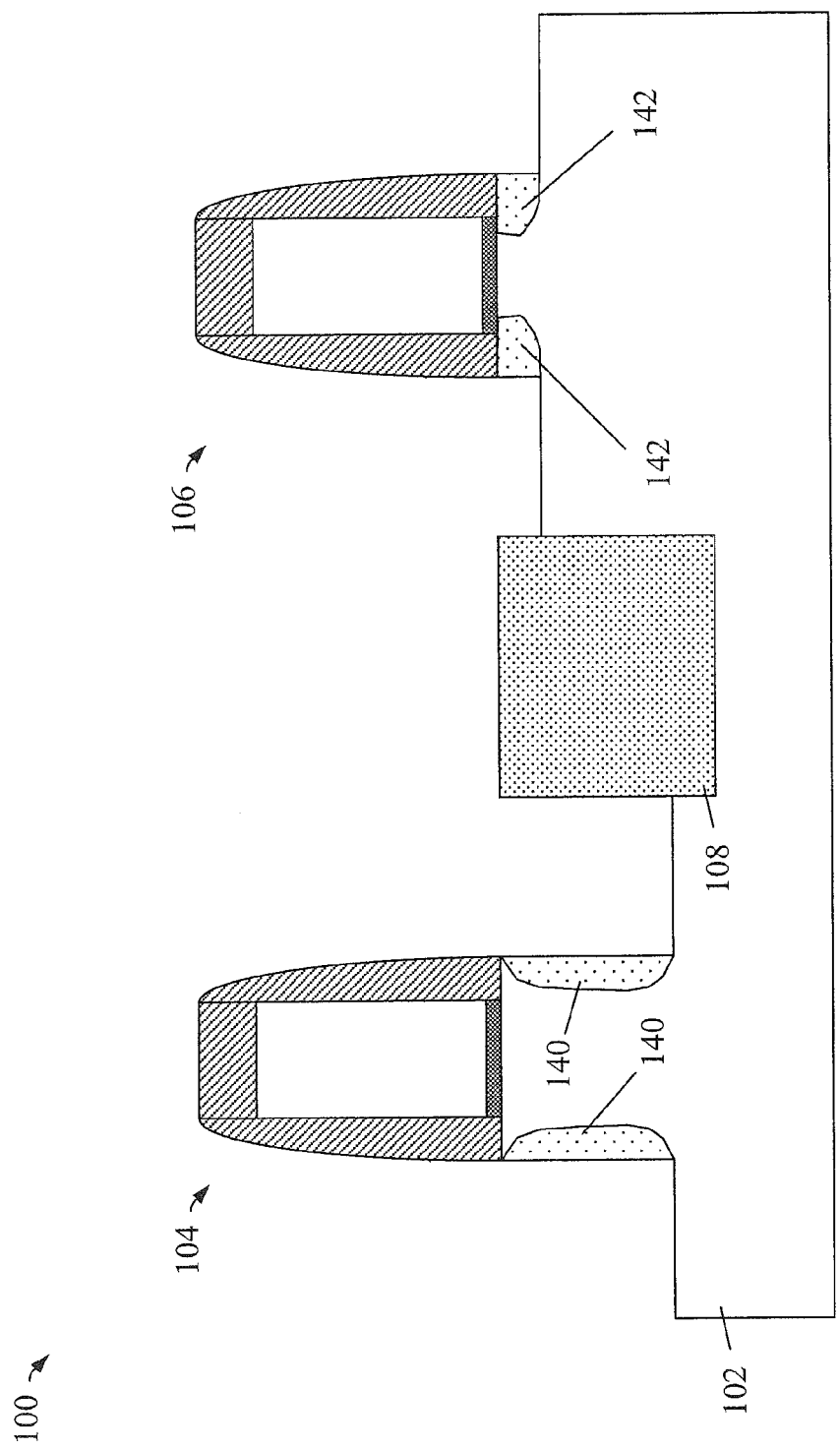
Figure 13:
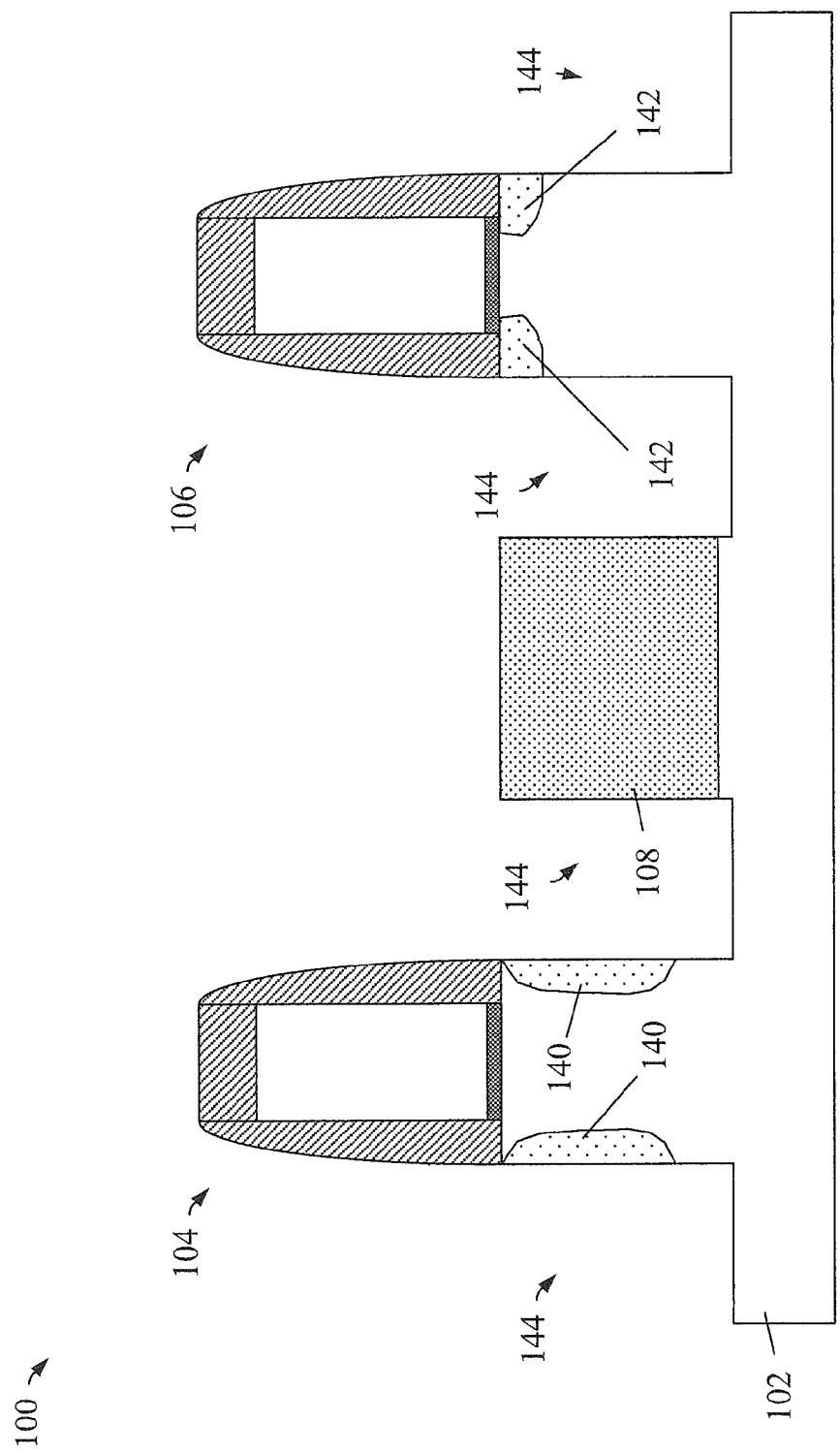
Figure 14:
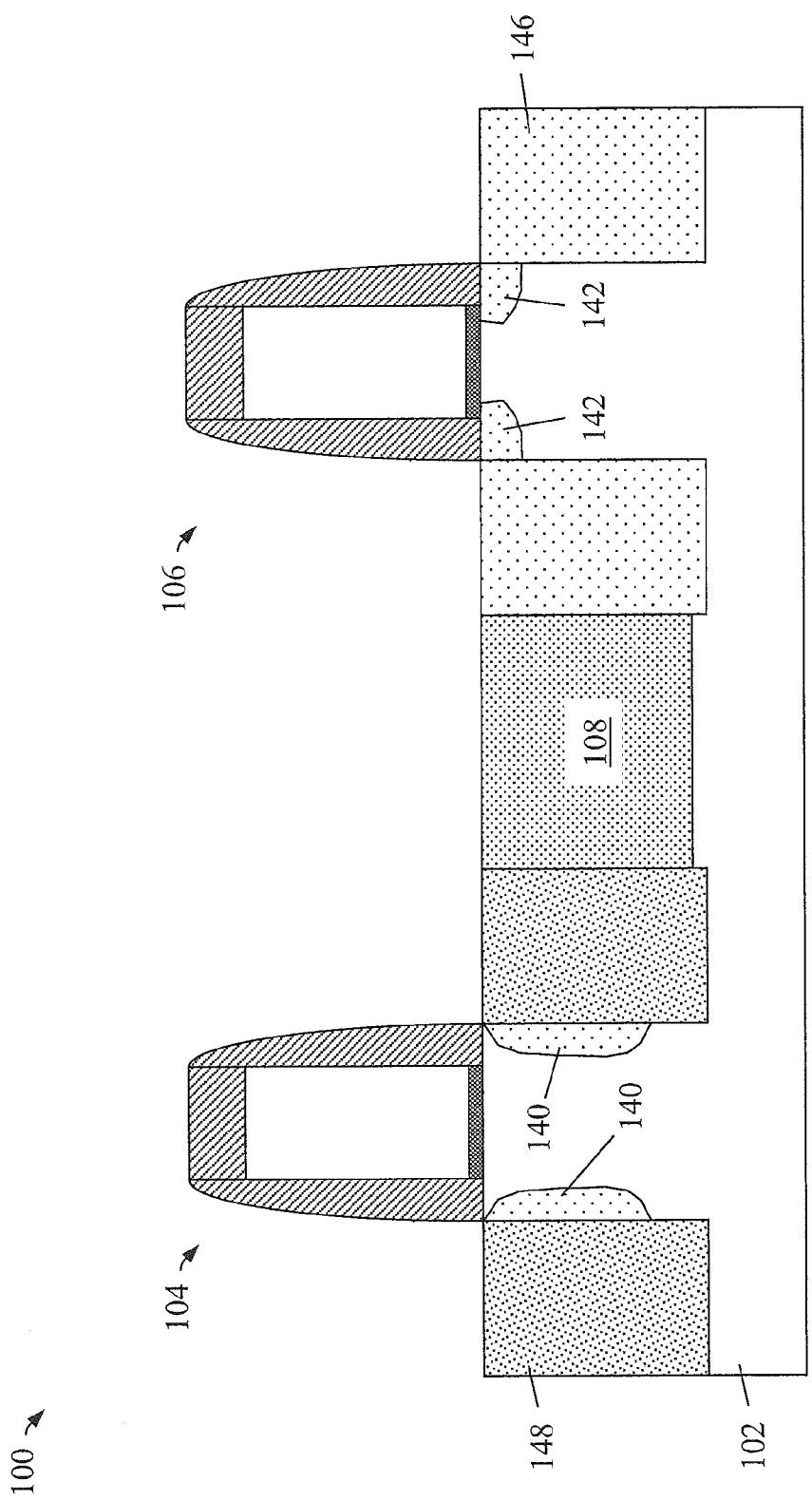

Referring to FIG. 12, remaining portions of the boron doped SiGe material 138 not forming either the halo regions 140 of the NFET device 104 or the extension regions 142 of the PFET device 106 are removed, such as through a selective etch of SiGe material with respect to silicon. Then, as shown in FIG. 13, additional substrate etching of silicon is performed (e.g., by a dry silicon etch) selective to the gate sidewall spacer and hardmask material so as to completely define trenches 144 adjacent the NFET and PFET gate structures and corresponding to source and drain regions of the transistors. From this point, embedded source/drain stress layers with appropriate doping may be performed, such as was described in conjunction with FIGS. 7 and 8, for example. FIG. 14 illustrates the resulting embedded semiconductor stress materials 146, 148 for the PFET device 106 and NFET device 104, respectively. In the case of the PFET device 106, the semiconductor material 146 may be in situ, boron doped SiGe for example, while in the case of the NFET device 104, the semiconductor material 148 may be in situ, phosphorous doped SiC.

Figure 15:
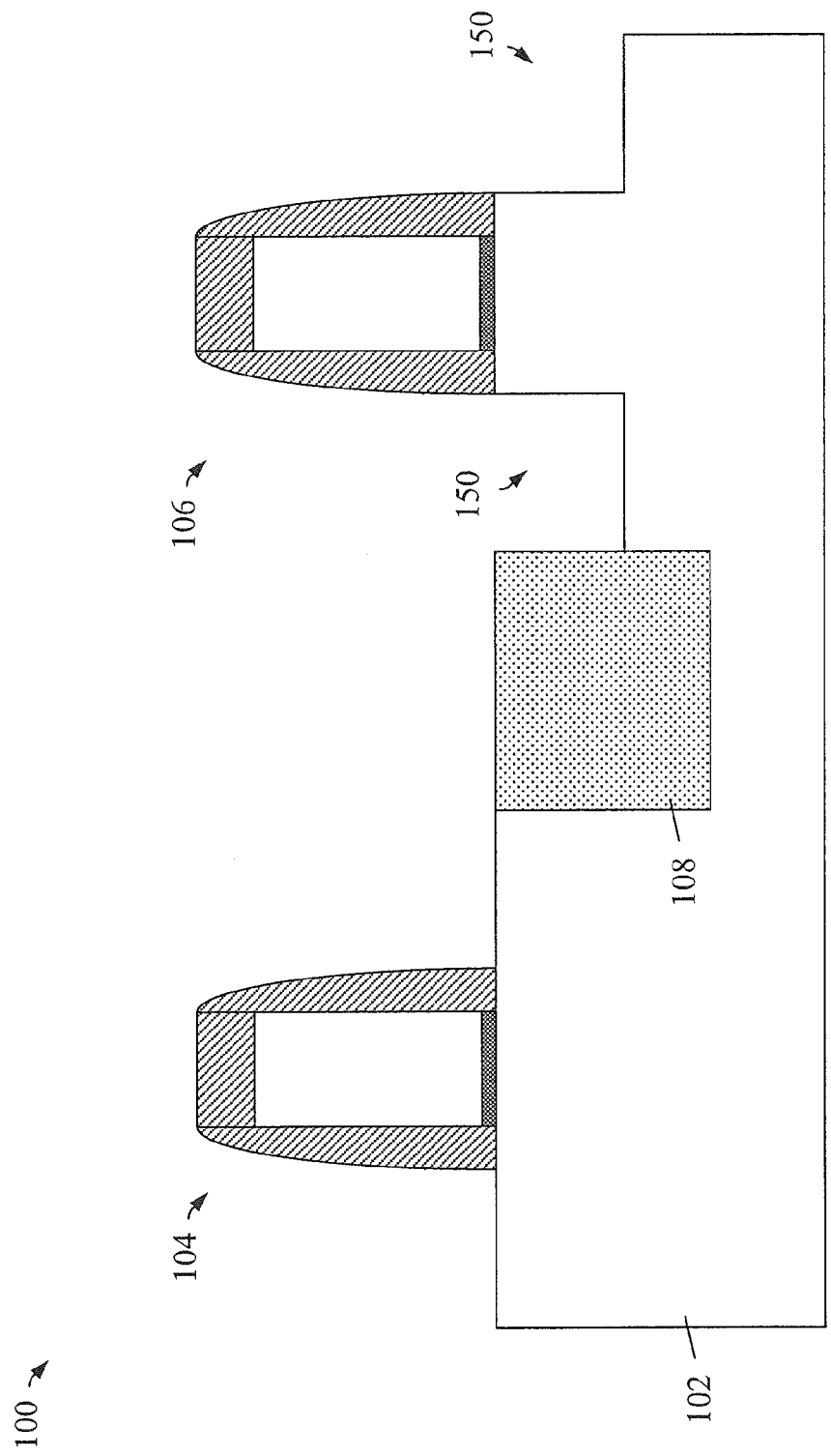

It should be appreciated that an alternative embodiment would be to create the extension regions for the NFET device and halo regions for the PFET device using a similar process flow. In this regard, FIGS. 15 through 20 are a series of cross sectional views illustrating a method of forming a transistor device having non-relaxed, embedded stressors with solid source outdiffused halo and extension regions, in accordance with another exemplary embodiment. After initial formation of an NFET device 104 and a PFET device 106 on a substrate 102 (such as in FIG. 1), FIG. 15 illustrates selective etching of trenches 150 in the substrate 102, adjacent the PFET gate structure corresponding to source and drain regions of the PFET device 106. The etching process may be, for example, a dry etch process or a wet etch process that is selective to the dielectric material used to form the sidewall spacers and gate protective hardmask. The etching process is also selective to the dielectric material used to form the shallow trench isolation 108. During this selective etching process, the NFET device 104 may be protected using, for example a patterned resist material or a patterned hardmask layer (not shown).

Figure 16:
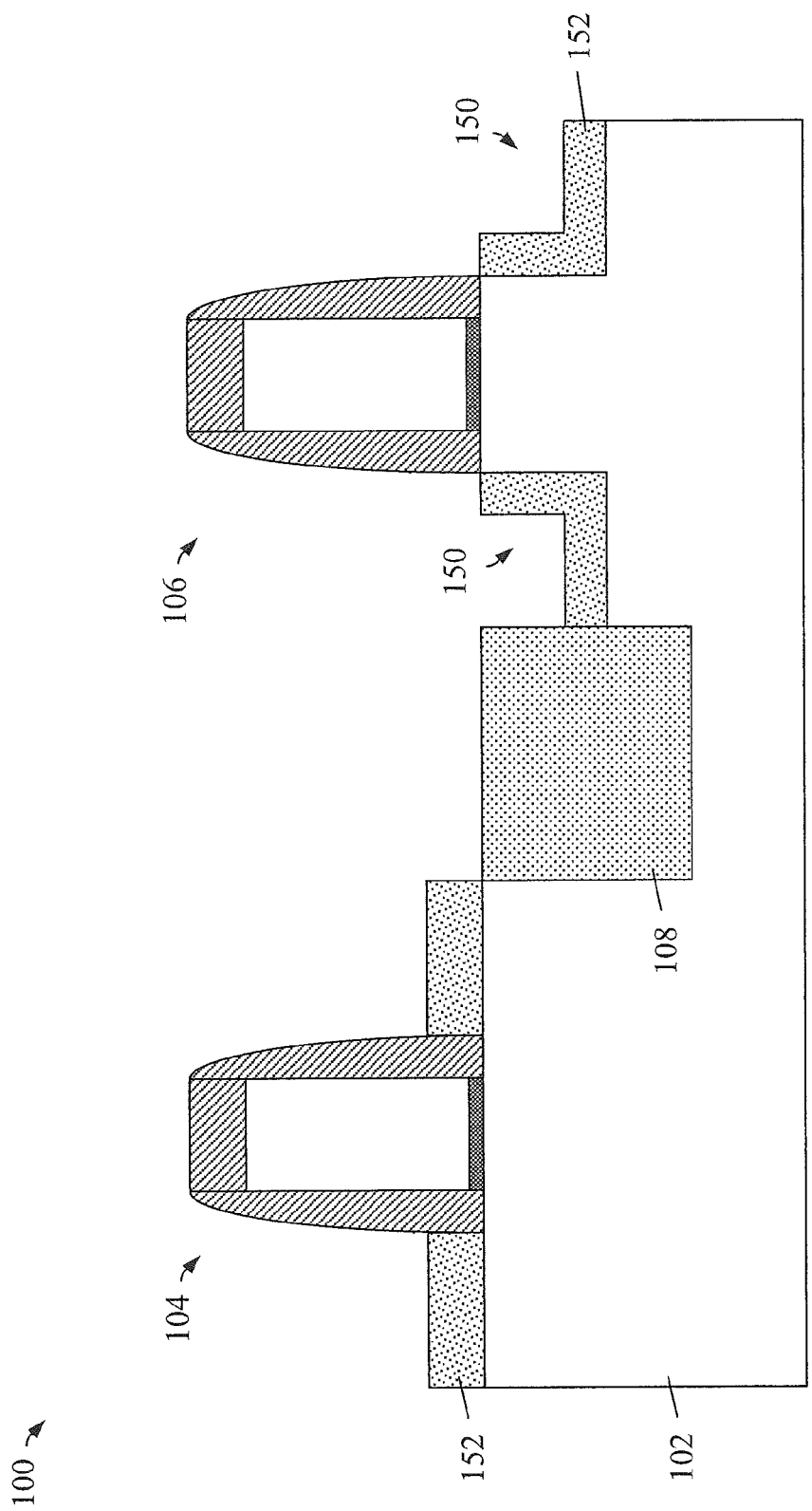
Figure 17:
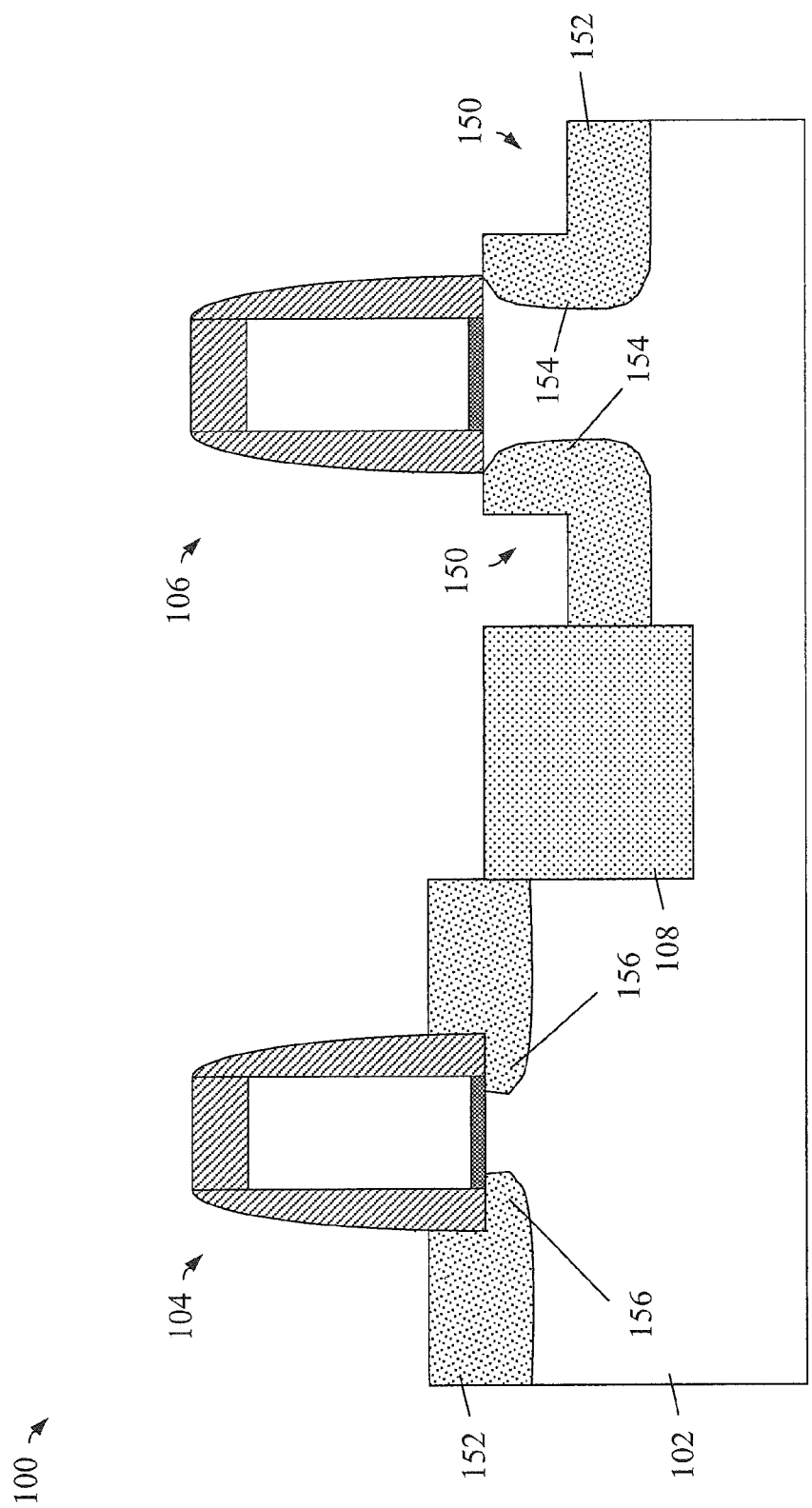
Figure 18:
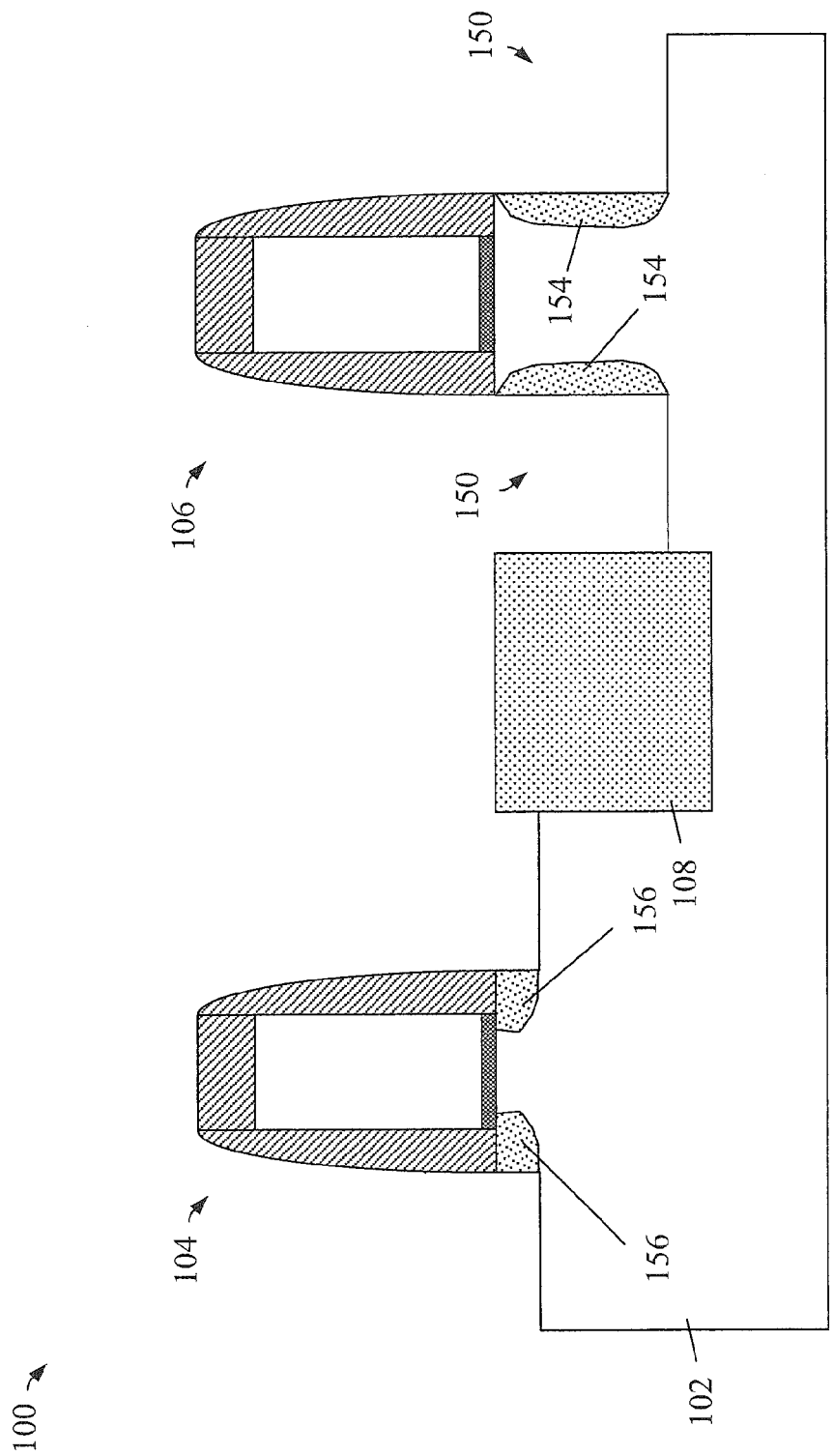

Then, as shown in FIG. 16, an in situ, phosphorus doped silicon carbon material 152 is epitaxially grown on the substrate 102. In the case of the NFET device 104, the doped SiC material 152 is formed adjacent the gate sidewall spacers, and in the case of the PFET device 106, the doped SiGe material 152 is formed along bottom and sidewall surfaces of the trenches 150 in the substrate 102. Once the phosphorus doped silicon carbon material 152 is in place, the device 100 is subject to a relatively high temperature annealing process so as to out diffuse the boron dopant materials, thereby forming both PFET halo regions 154 and NFET extension regions 156 as shown in FIG. 18. This high temperature process may be, for example, a rapid thermal anneal (RTA) such as a spike anneal at a temperature of about 1080° C. Again, this high temperature out diffusion process is performed prior to embedded stress layer formation for the transistor devices. Optionally, the substrate beneath the PFET device 106 may be laterally etched for optimal halo region location.

Figure 19:
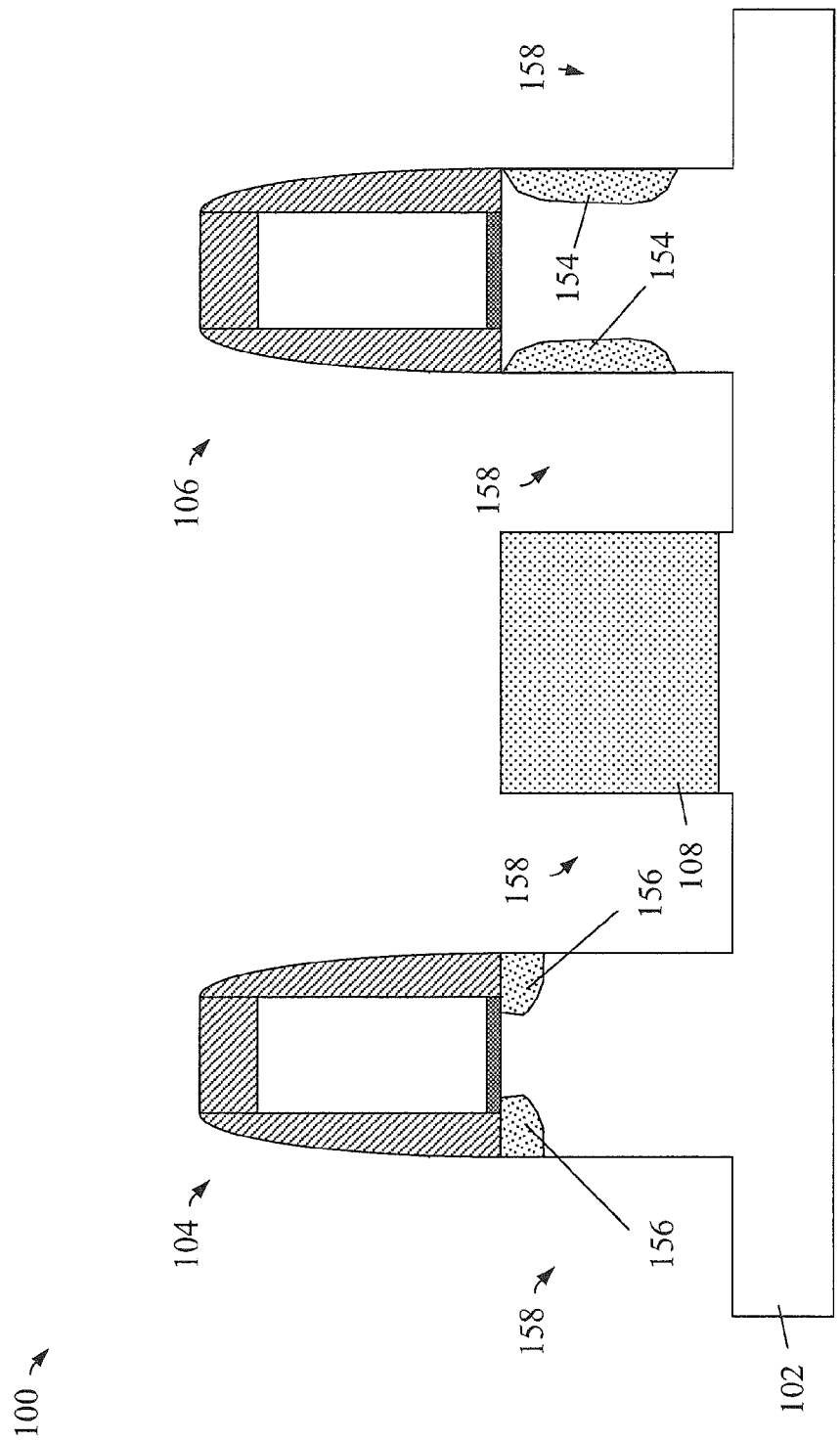
Figure 20:
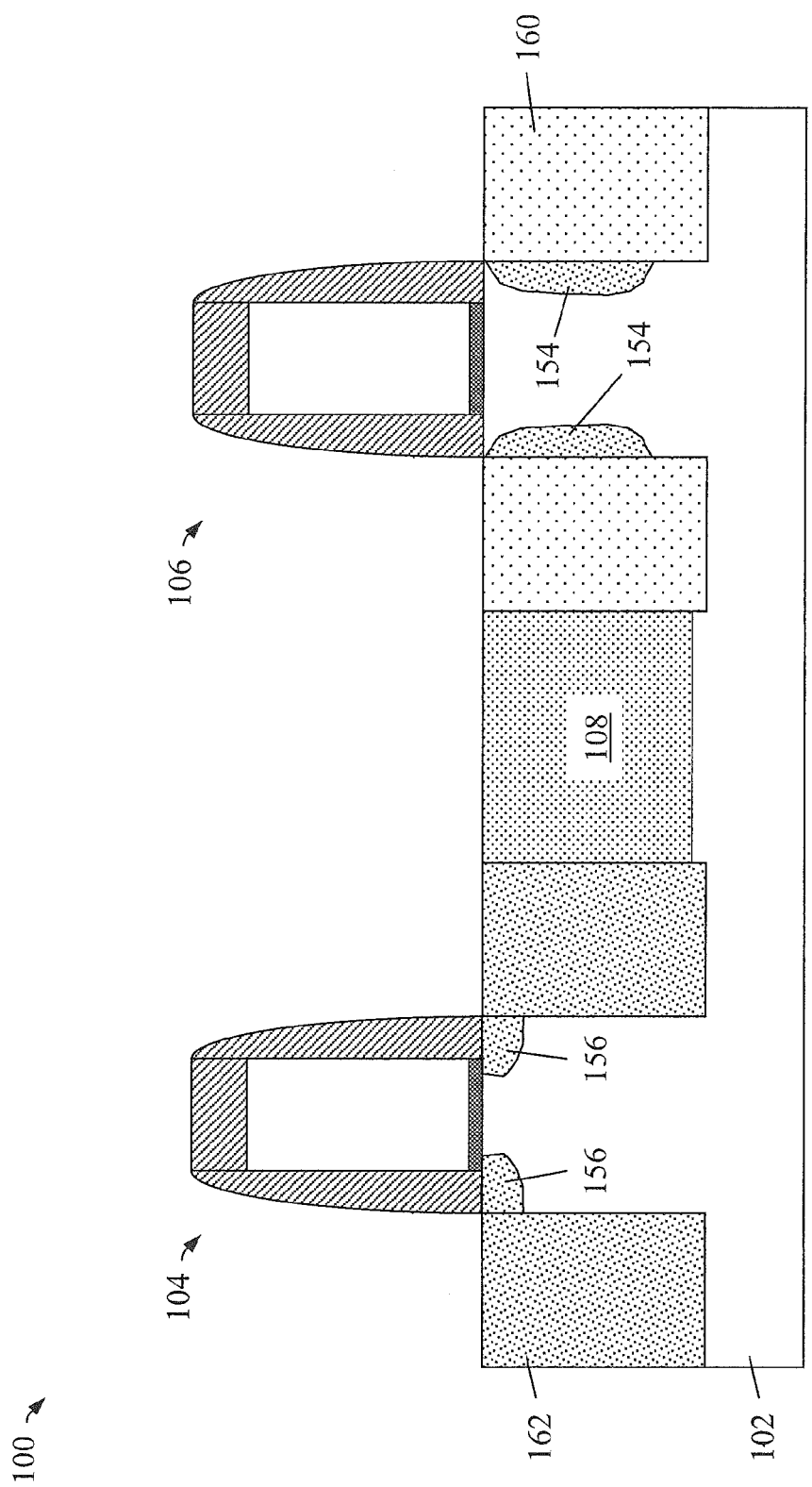

Referring to FIG. 19, remaining portions of the phosphorus doped SiC material 152 not forming either the halo regions 154 of the PFET device 106 or the extension regions 156 of the NFET device 104 are removed, such as through a selective etch of SiC material with respect to silicon. Then, as shown in FIG. 19, additional substrate etching of silicon is performed (e.g., by a dry silicon etch) selective to the gate sidewall spacer and hardmask material so as to completely define trenches 158 adjacent the NFET and PFET gate structures and corresponding to source and drain regions of the transistors. From this point, embedded source/drain stress layers with appropriate doping may be performed, such as was described in conjunction with FIGS. 7 and 8, for example. FIG. 20 illustrates the resulting embedded semiconductor stress materials 160, 162 for the PFET device 106 and NFET device 104, respectively. In the case of the PFET device 106, the semiconductor material 160 may be in situ, boron doped SiGe for example, while in the case of the NFET device 104, the semiconductor material 162 may be in situ, phosphorous doped SiC.

Still another possible embodiment may to form the halo regions for both NFET and PFET devices by the solid source outdiffusion, followed by form the extension for both FETs using the solid source outdiffusion approach, and then finally to create the deep trench and fill each FET with stressed boron doped SiGe and phosphorous doped SiC as described above. It will further be appreciated that the solid source diffusion process for source/drain extension regions and/or halo regions for either NFET or PFET devices may be performed in any suitable order, so long as the high temperature out diffusion anneal process is carried out prior to embedded source/drain stress layer formation. In so doing, such a high temperature process is prevented from relaxing the embedded source/drain stress layers.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming complementary metal oxide semiconductor (CMOS) devices, the method comprising:
    forming a patterned field effect transistor FET gate structure of a first polarity type and a patterned FET gate structure of a second polarity type over a substrate;
    selectively forming trenches in the substrate adjacent sidewall spacers of the FET gate structure of the first polarity type;
    forming a solid source dopant material on the substrate, in the trenches adjacent the sidewall spacers of the FET gate structure of the first polarity type, and adjacent sidewall spacers of the FET gate structure of the second polarity type;
    performing an anneal process at a temperature sufficient to cause dopants from the solid source dopant material to diffuse within the substrate beneath the FET gate structure of the second polarity type and FET gate structure of the first polarity type, respectively, so as to form source/drain extension regions beneath the FET gate structure of the second polarity type and halo regions beneath the FET gate structure of the first polarity type;
    removing remaining portions of the solid source dopant material not diffused beneath the FET gate structure of the second polarity type and FET gate structure of the first polarity type;
    forming additional trenches in the substrate adjacent the sidewall spacers of the FET gate structures, corresponding to source/drain regions;
    forming a first embedded semiconductor material in the additional trenches adjacent the sidewall spacers of the FET gate structure of the first polarity type so as to provide a first type of stress on a channel region of the substrate defined beneath the FET gate structure of the first polarity type; and
    forming a second embedded semiconductor material in the additional trenches adjacent the sidewall spacers of the FET gate structure of the second polarity type so as to provide a second type of stress on a channel region of the substrate defined beneath the FET gate structure of the second polarity type.

2. The method of claim 1, wherein:
    the first polarity type is n-type;
    the second polarity type is p-type;
    the first type of stress is tensile stress; and
    the second type of stress is compressive stress.

3. The method of claim 2, wherein the solid source dopant material comprises boron doped silicon germanium.

4. The method of claim 3, wherein the anneal process comprises a rapid thermal anneal (RTA).

5. The method of claim 4, wherein the RTA comprises a spike anneal performed at a temperature of about 1080° C.

6. The method of claim 1, wherein:
    the first polarity type is p-type;
    the second polarity type is n-type;
    the first type of stress is compressive stress; and
    the second type of stress is tensile stress.

7. The method of claim 6, wherein the solid source dopant material comprises phosphorous doped silicon carbon.

8. The method of claim 7, wherein the anneal process comprises a rapid thermal anneal (RTA).

9. The method of claim 8, wherein the RTA comprises a spike anneal performed at a temperature of about 1080° C.

* * * * *